United States Patent [19]

Michael

[11] Patent Number: 4,460,983
[45] Date of Patent: Jul. 17, 1984

[54] INTEGRATED DYNAMIC READ-WRITE MEMORY

[75] Inventor: Ewald Michael, Haar, Fed. Rep. of Germany

[73] Assignee: Siemens Aktiengesellschaft, Berlin and Munich, Fed. Rep. of Germany

[21] Appl. No.: 470,527

[22] Filed: Feb. 28, 1983

[30] Foreign Application Priority Data

Mar. 2, 1982 [DE] Fed. Rep. of Germany ....... 3207498

[51] Int. Cl.³ ............................................ G11C 13/00
[52] U.S. Cl. ..................................... 365/189; 365/207
[58] Field of Search ...................... 365/189, 230, 207; 357/45

[56] References Cited
PUBLICATIONS

"1977 IEEE International Solid–State Circuits Conference", pp. 12 and 13, by Paul R. Schroeder & Robert J. Proebsting, Feb. 16, 1977.

*Primary Examiner*—Terrell W. Fears
*Attorney, Agent, or Firm*—Herbert L. Lerner; Laurence A. Greenberg

[57] ABSTRACT

An integrated read-write memory matrix on a semiconductor chip with related comparators and significant address and clocking means for improved operation.

19 Claims, 4 Drawing Figures

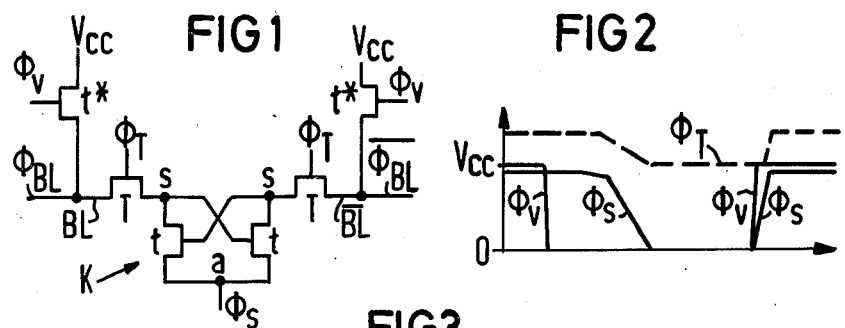
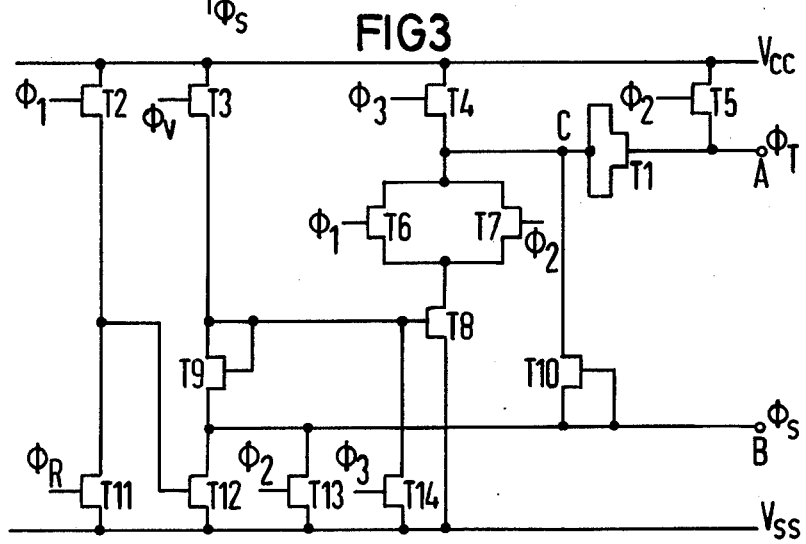
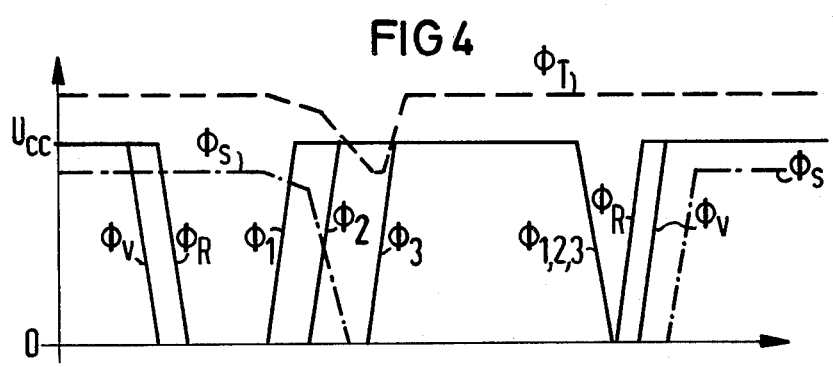

INTEGRATED DYNAMIC READ-WRITE MEMORY

The invention relates to an integrated read-write memory and, more particularly, to such a memory having memory cells formed as single transistor memory cells and disposed along rows and columns of a matrix on a semiconductor chip containing the memory, each matrix column having assigned thereto a respective comparator, for example in the form of an RS flip-flop, and at least one comparison cell, respectively, having a construction corresponding to that of the memory cells and, together with corresponding comparator cells of the remaining matrix columns, forming an additional matrix row addressing by the columns being effected via a respective bit line which combines the memory cells of the individual columns together with the corresponding comparison cell, and addressing by the rows being effected via a respective word line which combines the single-transistor memory cells belonging to the respective matrix row, the comparator having a voltage drive provided, on one hand, by signals fed to the corresponding bit line and, on the other hand, by a clocked connection between a supply potential and a terminal of the comparator to which the supply potential is applicable.

In the conventional organization of such dynamically operated read-write memories, there is assigned to each column of the memory matrix a respective bit line which is arranged parallel to the columns and is connected to the transistor memory cells provided in the respective matrix column, the bit line being connected to one of the inputs of the comparator. To the other output of the comparator, there is then connected a comparison cell which, together with the comparator, permits a determination of the digital operating state of a memory cell of the respective matrix column selecting by the addressing.

Both the individual memory cells as well as the individual comparison cells are constructed as so-called single-transistor memory cells. They are formed of a respective self-blocking MOS-transfer transistor, particularly of the n-channel type, the source or drain, respectively, of which is connected to the corresponding bit line, and the gate of which is connected to the word line which is assigned to the respective memory cell and is arranged along the matrix row containing the respective memory cell. The other current carrying terminal (drain or source, respectively,) of the transfer transistor of the respective memory cell is connected to one pole of a storage capacity, provided particularly by an MOS varactor, the second pole of which is connected to a fixed potential of the circuit, for example, reference potential (ground). For the comparison cells, an addressing line (dummy line) corresponding to the word lines of the individual matrix rows is provided, via which the gates of the transfer transistors of the comparison cells, which form an additional matrix row, are addressed via a decoder. Otherwise, the construction as well as the connection of the individual comparison cells (dummy cells) corresponds to the conditions in the memory cell proper. The transfer transistors of the memory cell belonging to the individual matrix rows and thereby, word lines, are connected, as indicated hereinbefore, jointly by the gates thereof to the respective word line and are addressed via the latter.

According to experience, the course in time of the so-called internal evaluation i.e. the operation, of the mutually identical comparators in the matrix columns is of decisive importance for the access time in dynamic memories. What is desired, therefore, is a reaction of the comparators to the corresponding bit line signals and word line signals which is as fast as possible. A heretofore known meausre for this purpose is a reduction of the bit line capacity or a precharging of the bit lines, respectively, in order to shorten the charging and discharging time of the capacitors provided in the individual memory and comparison cell.

It is an object of the invention to provide a further possible embodiment of an integrated read-write memory which is suitable for shortening the response time.

With the foregoing and other objects in view, there is provided, according to the invention, an integrated read-write memory having memory cells formed as single-transistor memory cells and disposed along rows and columns of a matrix on a semiconductor chip containing the memory, each matrix column having assigned thereto a respective comparator and at least one comparison cell, respectively, having a construction corresponding to that of the memory cells and, together with corresponding comparison cells of the remaining matrix columns, forming an additional matrix row, addressing by the columns being effected via a respective bit line combining the storage cells of the individual columns together with the corresponding comparison cell, and addressing by the rows being effected via a respective word line combining the single-transistor memory cells belonging to the respective matrix row, the comparator having a voltage drive provided, on one hand, by signals fed to the corresponding bit line and, on the other hand, by a clocked connection between a supply potential and a terminal of the comparator to which the supply potential is applicable, including a respective clocked transfer transistor forming a connection between two signal terminals of the comparator and the single-transistor memory cells and the comparison cells, respectively, controlling the signal terminals; a circuit part for generating a clock signal acting jointly on respective gates of the respective transfer transistors, the circuit part being controllable in turn by a clock signal timing the connection between the supply potential and the corresponding supply terminal of the comparator; the circuit part being of such construction that, due to the individual clock signal furnished thereby, the transfer transistors are in a heavily conducting state prior to connection of the comparator to the supply potential and are then switched over and cut off, respectively, simultaneously with activiation of the comparator to a state with a higher resistivity than in the heavily conducting state, and then, immediately at the end of the negative edge of the clock signal applying the supply potential to the supply terminal of the comparator, the highly conducting state of the transfer transistors is restored.

In accordance with another feature of the invention the comparator is formed as an RS flip-flop.

In accordance with a further feature of the invention the supply potential is ground potential.

In accordance with an additional feature of the invention the circuit part for generating the clock signal for controlling the transfer transistors is formed of mutually identical self-blocking field-effect transistors.

In accordance with an added feature of the invention the self-blocking field-effect transistors are of n-channel type.

In accordance with still another feature of the invention there is provided a first and second transistor shunted across one another and connected by respective source terminals thereof via a drain-source path of a third transistor to a reference potential and, via a source-drain path of a fourth transistor to the supply potential; the first transistor having a gate controlled by a first clock signal, the second transistor having a gate controlled by a second clock signal, the third transistor having a gate controlled by the clock signal controlling the supply terminal of the comparator, and the fourth transistor having a gate controlled by a third clock signal; and a circuit node between the first and the second transistor and the fourth transistor having potentials thereat, on the one hand, for controlling an output supplying the clock signal for the transfer transistors and, on the other hand, being themselves influenced by the clock signal timing the supply for the comparator, in addition to being controlled via the third transistor.

In accordance with yet another feature of the invention the circuit node is connected, on the one hand, via a capacitance, to the output supplying the clock signal for controlling the transfer transistors, and is acted upon, on the other hand, via a source-drain path of a fifth transistor, by the clock signal timing the comparator supply which simultaneously acts on a gate of the fifth transistor for timing the supply for the comparator, and the output for supplying the clock signal for the transfer transistors at the respective signal terminals of the comparators being connected to the supply potential via a source-drain path of a sixth transistor controlled by the second clock signal.

In accordance to still a further feature of the invention there is provided a resistance connected to the gate of the third transistor for controlling the third transistor by the clock signals controlling the supply of the comparators.

In accordance with again an additional feature of the invention the resistance is a transistor connected as a resistor.

In accordance with yet another feature of the invention the capacitance connected to the output supplying the clock signal for controlling the transfer transistors is a field-effect transistor connected as a varactor, and being of the same type as the other transistors in the memory.

In accordance with again a further feature of the invention the transistor connected as a varactor has a source and a drain connected to the circuit node between the fourth transistor and the first and second transistors, and has a gate connected directly to the output supplying the clock signal for controlling the two transfer transistors to the comparator.

In accordance with still another feature of the invention the gate of the third transistor is connected via a source-drain path of a further transistor controlled by the third clock signal to reference potential.

In accordance with yet an additional feature of the invention there is provided a first transistor for generating the clock signal for controlling the supply terminal of the individual comparators the first transistor being controlled by a resetting signal and having a source terminal connecting the first transistor to the reference potential and having a drain for controlling a second transistor the second transistor having a source terminal connecting the second transistor to the reference potential, and having a drain connecting the second transistor to the supply potential via a third transistor controlled by a first clock signal, the drain of the second transistor being a signal output for the clock signal for controlling the supply terminal of the comparators and a fourth transistor connected in parallel with the second transistor, the fourth transistor having a gate acted upon by a second clock signal, the parallel circuit of the second and the fourth transistors being connected to the supply potential via a fifth transistor controlled by a control pulse provided for precharging the bit lines of the memory matrix.

In accordance with still an additional feature of the invention there is provided another transistor connected between the fifth transistor on the one hand and the second and the fourth transistos, on the other hand, the other transistor having a gate connected to a source of the fifth transistor.

In accordance with still a further feature of the invention a source of the fifth transistor as well as the drain of the second and the fourth transistors, respectively, are connected to the circuit part for generating the clock signal for controlling the transfer transistors.

In accordance with again another feature of the invention the drain of the second transistor supplies the clock signal applying the supply potential to the supply terminal of the comparators and is connected to a drain and a gate of the fifth transistor in a circuit part generating the clock signal acting on the transfer transistors, and the source of the fifth transistor is directly connected to the gate of the third transistor in the last mentioned circuit part.

In accordance with again an additional feature of the invention the clock signals for controlling the circuit part for generating the control pulses for the supplying of the comparators and the corresponding transfer transistors are matched in time with respect to one another in such a manner that the first, the second and the third clock signals have pulses which end simultaneously, each pulse of the first clock signal setting in earlier in time than the corresponding pulse of the second clock signal and the latter pulse setting in earlier than the corresponding pulse of the third clock signal.

In accordance with yet a further feature of the invention a clock pulse serving for precharging the bit lines starts in time later than the corresponding resetting pulse and ends earlier than the corresponding resetting pulse, and the resetting pulses always fall into a pause between two successive first signal pulses without overlapping the adjacent first signal pulses.

In accordance with a concomitant feature of the invention the circuit node between the first, the second and the fourth transistors is connected directly to the output supplying the clock signal for timing the transfer transistors at the comparators, and is further connected via a capacitor to the circuit point carrying the clock signal for controlling the supply terminal of the comparators.

Other features which are considered as characteristic for the invention are set forth in the appended claims.

Although the invention is illustrated and described herein as embodied in an integrated dynamic read-write memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a conventional circuit diagram of a dynamic read-write memory showing the connection of the comparator for the individual matrix columns of the RAM memory;

FIG. 2 is a timing diagram showing, besides the basically customary drive for the bit line precharge $\phi_v$, the evaluation in the comparator $\phi_s$ and the control of the transfer transistors provided, in accordance with the invention, by the signal $\phi_T$ and, thereby, of the connection between the comparator and the corresponding bit line;

FIG. 3 is a diagram of a particularly advantageous circuit both for generating the clock signals $\phi_s$ for supplying the individual comparators as well as, particularly, the signal pulses serving for generating the pulsing of the aforementioned transfer transistors; and FIG. 4 is a timing diagram governing the operation of the circuit according to FIG. 3.

Referring now to the drawing and first, particularly, to FIG. 1 thereof, there is shown a comparator K formed of two identical MOS field-effect transistors of the self-locking type which, preferably, are of the n-channel type like the other transistors of the circuit. The two outputs s of the comparator K are provided by the drain of a respective one of the two transistors t and the gate of the respective other of the two transistors t of the comparator K, while the two source terminals of these two transistors t form a supply input a for the comparator K. The latter is acted upon by a clocked supply signal $\phi_s$, which is realized, for example, by the reference potential (ground). The other supply potential for the comparator K is provided by the level of the signals which are fed via two transfer transistors T from a bit line BL or $\overline{BL}$, respectively, to respective signal terminals s of the comparator K.

The two transistors T form the connection between a respective one of the two signal terminals s of the comparator K realized as an RS flip-flop or also, in another conventional manner, realized with respectively associated non-illustrated single transistor memory cells and comparison cells. Details regarding this are found, for example, in German Published Prosecuted Application (DE-AS) 30 02 017 or in "1977 IEEE International Solid-State Circuits Conference", pages 12 and 13. With regard to the last-mentioned publication reference it should be noted that also there, the two signal terminals of the comparator K are connected via a respective MOS field-effect transistor to the corresponding bit line sections. However, these transistors are not driven by a clocked signal, but rather by a constant potential.

As is already apparent from the last-mentioned pulbication reference, it is advisable, in the interest of faster response of the comparator K, to pre-charge the bit line sections BL and $\overline{BL}$, which are to be connected to the signal terminals s of the comparator, before they are acted upon by a write signal or a read signal, respectively, so that there results, on the one hand, a shorter write time into the storage cells or comparison cell associated with the respective bit line BL or $\overline{BL}$, respectively, as well as a higher readout speed, and this manifests itself also in an acceleration of the response of the comparator. This purpose is served by charging transistors t* which are controlled by a common clock signal $\phi_v$ and connected between the individual bit line section BL and $\overline{BL}$, respectively, and the supply potential $V_{CC}$. The precharging transistors t* are in the blocked state during the writing operation as well as during the read operation on the bit line BL and $\overline{BL}$ assigned to the comparator K, and are in the conducting state during the operating pauses. Accordingly, the behavior in time of the precharging pulses $\phi_v$ controlling the transistors t*, as shown in FIGS. 2 and 4, is arranged. What is sought after, in accordance with the invention, is then that the two transfer transistors T be jointly controlled by pulses $\phi_T$ which, with respect to the bit line BL and $\overline{BL}$ belonging to the respective comparator K, have the wave form seen in FIG. 4, which is also expressed in the definition of the invention. The following aspects are applicable:

As is well known the timing cycle of the internal signal evaluation by the comparators K is of decisive importance for the access time of dynamic memories. The signal furnished by the respective addressed memory cell or comparison cell or the reference signal, respectively, is fed to the comparator. Critical for driving the two transfer transistors T is the relation thereof in time to the evaluation which is initiated at the supply terminal a by a respective one of the pulses $\phi_s$. In order to obtain a more reliable evaluation by the comparator K, the two transfer transistors T are made to have a higher resistivity than in the normal conducting state, without cutting off the transistor T. (The alternative likewise provided in the definition of the invention, of compleately cutting off the transistors T will be discussed hereinafter). Subsequent to the evaluation of the operating state of the respectively selected memory cell and comparison cell among the single-transistor memory cells belonging to the respective comparator K, the logic signal made available, on the basis of the evaluation and the setting of the comparator K connected therewith, to the terminals s of the latter is passed-on to the corresponding bit line section BL and $\overline{BL}$, respectively.

Due to the invention, the following behavior is provided, there having first to be ascertained that there is in every case a respective signal difference (i.e. the difference between two logic levels "0" and "1") between the two signal terminals s of the comparator K, which difference is to be transmitted to the two corresponding sections BL and $\overline{BL}$ of the bit line. Beforehand, however, the signal difference existing between the two bit line sections BL and $\overline{BL}$ must be passed-on to the comparator K so that it can be evaluated by the latter. In the first phase for this transmission, the two transfer transistors T are made to have low-resistance or resistivity and they are therefore in a highly conducting state. Thereby, the control of the comparator K via the two bit line sections BL and $\overline{BL}$ can occur very rapidly, whereby the comparator K is flipped into one or the other direction, depending upon which side (BL or $\overline{BL}$) the higher potential is present corresponding to the applied logic information "0" or "1".

The reaction of the comparator K upon the two bit line sections BL and $\overline{BL}$ sets in after the falling edge of the pulse $\phi_s$ controlling the supply input a. In order to accelerate the flipping of the comparator K which is triggered by the charging of the capacity of the two transistors t in the comparator, provision is made in accordance with the invention, that the drain or leakage of this charge via the one or the other of the two transistors t in the comparator K is accelerated by the provision that the large capacities at the bit line BL and $\overline{BL}$ are decoupled by the transfer transistors T which are switched to high resistance or resistivity (or are even cut off). It must be noted that, due to the cross talk in the comparator K, a charge equalization is initiated in principle between the bit line sections BL and $\overline{BL}$, which by itself causes a delay of the flipping. As a remedy, the two bit line sections BL and $\overline{BL}$ are either completely cut off or at least made to have sufficiently high resistance immediately after the supply of the amount of charge necessary for triggering the flipping process, even before the flipping process sets in, largely through suitable control of the gates of the transfer transistors.

Simultaneously with the end of the supply pulse $\phi_s$ which is present at the supply input a of the comparator K during a possible flipping of the comparator K from the one into the other operating state, the connection between the comparator K and the two corresponding bit line sections BL and $\overline{BL}$ is opened again or made low-resistance, respectively, in accordance with the invention, so that the logical state then present at the two signal terminals s of the comparator K can act immediately upon both of the bit-line sections BL and $\overline{BL}$.

The circuit according to the invention shown in FIG. 3 for a read-write memory simultaneously fulfills two purposes, namely (a) generation of the pulses $\phi_t$ required for the timing of the transfer transistors T, and (b) generation of the pulses $\phi_s$ required for the timing of the supply voltage for the comparator K. Since, advantageously, all of the comparators K of the memory are controlled simultaneously, the pulses $\phi_s$ and $\phi_t$ generated by a system according to FIG. 3 are fed to all these comparators K simultaneously. The circuit part proposed further in accordance with the invention, for generating the pulses $\phi_T$ controlling the transfer transistors T is formed of MOS-FETs T1, T4, T5, T6, T7, T8 and T10, the transistor T1 being also able to be replaced by a capacitor. In that case, the one pole of the capacitor then forms the replacement for the gate, and the other pole the replacement for the source and the drain terminal of the transistor T1.

The clock pulse $\phi_s$ which serves simultaneously for controlling the supply voltage for the comparators K is fed to the source and the gate of the transistor T10, the drain of which is connected directly to the source and to the drain of the transistor T1 which is provided as a varactor capacity. The gate of this transistor T1 is connected to the output terminal A which supplies the desired clock signal $\phi_T$ for the two transfer transistors T and in referred to the reference potential $V_{ss}$. In addition, the gate of the transistor T1 is connected to the source terminal of a further self-blocking MOS transistor T5 which is controlled by a first controlling clock signal $\phi_2$, the drain of this transistor T5 being directly acted upon by the supply potential $V_{cc}$.

The clock signal $\phi_s$ which is responsible for supplying the comparators K is furthermore connected, in particular via a resistor (which, in the illustrated embodiment, is provided by the transistor T9), to the gate of the transistor T8. This transistor T8 is further connected by its source to the reference potential $V_{ss}$, and by its drain to a common source terminal of the two transistors T6 and T7 which are connected parallel to one another, a common drain terminal thereof leading, on the one hand, via the transistor T4, to the supply potential $V_{cc}$ and, on the other hand, to the drain of the transistor T10 as well as to the drain and the source of the hereinaforementioned transistor T1, as is apparent from FIG. 3. The transistor T7 is controlled by the same clock signal $\phi_2$ as is the transistor T5, while a second clock signal $\phi_1$ is required for controlling the transistor T6, and a third signal $\phi_3$ for controlling the transistor T4. The waveform of these clock signals is discussed hereinafter with reference to FIG. 4. Likewise, the operation of this circuit part serving for generating the signal $\phi_T$ will be dealt with hereinafter.

As far as circuit technology is concerned, it should further be noted that the two transistors T6 and T7 can be realized also by a single transistor with two separate and equivalent gates. The possibility of replacing the transistor T1 by a capacitor, one pole of which is connected to the signal output A and the other pole to the transistor T10 as well as to the transistors T4, T6 and T7, has already been described hereinbefore.

Furthermore, the circuit can be supplemented by a transistor T14 which forms a connection between the gate of the transistor T8 and the reference potential $V_{ss}$, and is controlled by the same clock signal as the transistor T4 i.e. by the signal $\phi_3$.

The part of the circuit shown in FIG. 3 which serves for generating the clock signal $\phi_s$ controlling the voltage supply, if formed of the MOS-field-effect transistors T2, T3, T9, T11, T12 and T13. For controlling it, the aforementioned clock signals $\phi_1$ and $\phi_2$ as well as the precharging clock signal $\phi_v$ (see FIG. 1) and a resetting signal $\phi_R$ are used.

The transistor T2 is connected by the drain thereof to the supply potential $V_{cc}$, and by the gate thereof to the clock signal $\phi_1$, and is connected by the source thereof, on the one hand, via the source-drain path of the transistor T11 controlled by the resetting signal $\phi_R$, to the reference potential $V_{ss}$ and, on the other hand, to the gate of the transistor T12. The source of this transistor T12, like the source of the transistor T13, which is connected to it in parallel, is at reference potential, while the drains of both transistors 12 and 13 are connected to the output B which carries the signal $\phi_s$ (referred to the reference potential $V_{ss}$) for applying the voltage to the comparators K, and for controlling the generation of the signal $\phi_T$. In addition, the drains of these two transistors T12 and T13 are connected via the source-drain path of the transistor T9 on the one hand to the gate of the transistor T9 and to the gate of the input transistor T8 of the circuit part serving for generating the signal $\phi_T$ and, on the other hand, to the source of a transistor T3 controlled by the precharging clock signal $\phi_v$ and, via this transistor T3, to the supply potential $V_{cc}$. It should further be mentioned that the aforementioned transistor T13, which is connected in shunt or parallel to the transistor T12, is controlled by the clock signal $\phi_2$ which also serves for controlling the aforementioned transistor T5 which is connected to the output A.

All of the transistors used in the circuit are self-blocking MOS field-effect transistors of the same channel type, particularly of the n-channel type. It can therefore be combined monolithically without difficulty with the customary RAM structures with single-transistor memory cells. As mentioned hereinbefore, it can serve for the common control of all bit lines and the respective associated comparator K. Only a single embodiment thereof is therefore required in the memory.

As a matter of fact, the following may be stated regarding the operation of the individual circuit parts according to FIG. 3:

(a) The transistor T1 connected as a varactor or a capacitor replacing it, respectively, causes the increase, as seen in FIG. 4, of the signal $\phi_T$ required for controlling the two transfer transistors T. A result of this increase is that the transistors T become highly conducting whereas, in the absence of such an increase, they are in a state of high resistance of resistivity.

(b) The transistors T2, T12 and T13 determine the falling edge or side of the pulses $\phi_s$ serving for controlling the supply inputs a of the comparator K. The precharging signal $\phi_v$ is generated in the usual manner.

(c) The transistor T11 fulfills a resetting function.

(d) The transistor T4 acts in the same sense as the transistor T1.

(e) The transistors T9 and T14 cut off the transistor T8 upon the occurrence of an increase, caused by the signal $\phi_3$, in the clock signal $\phi_T$ appearing at the output A.

(f) The transistors T6, T7 and T8 determine the waveform of the falling edge or side of the signal $\phi_T$ appearing at the output A.

(g) The transistor T3 serves for percharging the transistor T8.

(h) The transistor T10 serves for controlling the increase of the output signal $\phi_T$ by the rising edge or side of the signal $\phi_s$.

(i) The transistor T5 causes a precharging of the transistor T1 serving for generating the signal $\phi_T$ and, therefore, a positive base voltage for the signal $\phi_T$, which can be increased by coupling-in via the transistor T1.

(k) The transistor T4 controlled by the clock signal $\phi_3$ (which is referred to the cutoff voltage) produces the minimum of the signal $\phi_T$ and, accordingly, the high-resistivity state of the two transfer transistors T in FIG. 1.

The pulses $\phi_1$, $\phi_2$ and $\phi_3$ have falling edges or sides which coincide in time with one another, and rising edges or sides which are slightly shifted in time relative to one another in such a manner that, first, the pulse $\phi_1$ and then, with a small delay, the pulse $\phi_2$ and finally, with a small delay, the pulse $\phi_3$ appears. The resetting pulse $\phi_R$ sets in immediately with the diappearance of the pulse $\phi_1$, the pulse $\phi_2$ and the pulse $\phi_3$ and ends, with a spacing or distance in time, prior to the setting-in of the next-following pulse $\phi_1$. The precharging pulse $\phi_v$ coincides in time with the resetting pulse $\phi_R$; however, it ends somewhat earlier and begins somewhat later than the corresponding resetting pulse $\phi_R$.

The waveform of the aforementioned pulses, like the waveform of the pulses $\phi_s$ and $\phi_T$ generated by means of the system according to FIG. 3, is shown in FIG. 4.

The pulses $\phi_v$ and $\phi_R$ may be derived, for example by amplification, from supply pulses for the memory. By inversion with suitable delay stages, the starting edges or sides of the pulses $\phi_1$, $\phi_2$ and $\phi_3$ can be derived, for example, from the resetting pulse $\phi_R$. The common stop edge or side may be derived from the supply pulses analogously to the stop edges or sides of the pulses $\phi_R$ and $\phi_v$.

Regarding the operation of the circuit shown in FIG. 3, the following may now be said in detail:

(l) Generation of the pulse $\phi_s$: It can be seen from FIG. 1 that the precharging of the bit line sections BL, $\overline{BL}$ takes place via transistors t* addressed by the precharging pulse $\phi_v$. These transistors T (addressed by the pulse $\phi_T$) and the comparator transistors t, the precharging (positive voltage level) of the pulse $\phi_s$. The precharging of the pulse $\phi_s$ via the transistors T3 (addressed by the pulse $\phi_v$) and T9 has only an aiding or supporting function.

Prior to this precharge (initiated by the positive edge or side of the pulse $\phi_v$), the transistor T11 becomes conducting through the positive edge or side of the pulse $\phi_R$ and discharges the gate of the transistor T12 so that the latter cuts off and a precharge voltage of $\phi_s$ can therefore not flow off. The transistor T2 is cut off during this process (negative edge or side of the pulse $\phi_1$) in order to avoid a cross current through the transistors T2 and T11.

In order to obtain a more reliable evaluation by the comparators K, the negative edge or side of the pulse $\phi_s$ is generated in two steps: The positive side or edge of the pulse $\phi_1$ generates, through the conduction of the transistor T2 and, thereby, through the conduction of the transistor T12, the first flat part of the negative edge or side of the pulse $\phi_s$. The second steep part is generated by providing that the positive edge or side of the pulse $\phi_2$ controls the transistor T13 into conduction.

(2) Generation of the pulse $\phi_T$: In the precharging phase of the pulse $\phi_s$ (positive gate voltage at the transistor T3), the gate of T8 also is charged up by the transistor T3 and, thereby, the transistor T8 is therefore open. The transistors T6 and T7 remain cut off, and the node C between the transistors T4, T6 and T7 obtains a precharge via the transistor T10. During the positive edge or side of the pulse $\phi_1$, the transistor T6 opens so that the charge on the aforementioned node C begins to flow off via the transistors T6 and T8. Due to the positive edge or side of the pulse $\phi_1$ (via the transistors T2 and T12) the negative edge or side of the pulse $\phi_s$ also begins, which causes a slow drop in the gate voltage of the transistor T8 via the transistor T9. With the positive edge or side of the pulse $\phi_2$, an analogous process sets in as in the case of the pulse $\phi_1$. Connecting the transistors T6 and T7 in parallel therefore makes it possible to divide the flow-off of the charge from the node C into a slow and a fast phase if the dimensioning or design is different. Finally, this causes a flat and a steep compoenent of the negative side or edge of the pulse $\phi_T$.

During the positive edge or side of the pulse $\phi_2$, however, the supply pulse also drops off sharply and further reduces, via the transistor T9, the gate voltage at the transistor T8. If the pulse $\phi_s$ reaches the reference potential $V_{ss}$ (ground), the transistor T8 remains open because of the cutoff voltage of the transistor T9 (which should be kept higher than the cutoff voltage of the transistor T8). The charge on the node C can therefore continue to flow via the transistors T6, T7 and T8.

With the positive edge or side of the pulse $\phi_2$, the gate of the transistor T1 is charged up simultaneously (pulse $\phi_T$ precharge) and thereby, the varactor T1 or a capacitor used in its place, respectively, is charged. With the positive edge or side of the pulse $\phi_3$, the transistor T8 is cut off on the one hand via the transistor T14 (disconnecting the gate) and, on the other hand, the node C is charged again via the transistor T4. By capacitive coupling via the transistor T1, an increase of the precharged pulse $\phi_T$ is obtained. In the next operating cycle, the same capacitive coupling via the transistor T1 is obtained by the discharge of the node C via the transistor T6 and T7, but in the opposite direction. This means that the pulse $\phi_T$-voltage is lowered and increased again with the subsequent positive pulse $\phi_3$ edge or side, and so forth. The minimum voltage of the pulse $\phi_T$ may be limited by the precharging voltage of the transistor T5.

The maximum voltage changes of the pulse $\phi_T$ result from the voltage changes at the node C together with the ratio of the capacity of the varactor T1 or a capacitor replacing the same, respectively, to the load capacity of the pulse $\phi_T$ (not shown in FIG. 3). If the pulse $\phi_T$ is to be lowered not only partially but rather so as to reach the reference potential $V_{ss}$ (ground), the circuit shown in FIG. 3 is advantageously modified somewhat as follows:

The transistors T1 and T5 are omitted. The pulses $\phi_T$ are taken off directly at the node C, and the transistor T10 is replaced by a capacity. The increase of the pulse $\phi_T$ would the be generated only by the positive pulse $\phi_s$ edge or side.

Regarding the circuit in FIG. 3, it should further be noted that the transistors T5 and T10 serve mainly for aiding the starting (transient response) of the circuit according to FIG. 3.

The foregoing is a description corresponding to German application P 32 07 498.0, dated March 2, 1982, the International priority of which is being claimed for the instant application, and which is hereby made part of this application. Any discrepancies between the foregoing specification and the aforementioned corresponding German application are to be resolved in favor of the latter.

I claim:

1. Integrated read-write memory having memory cells formed as single-transistor memory cells and disposed along rows and columns of a matrix on a semiconductor chip containing the memory, each matrix column having assigned thereto a respective comparator and at least one comparison cell, respectively, having a construction corresponding to that of the memory cells and, together with corresponding comparison cells of the remaining matrix columns, forming an additional matrix row, addressing by the columns being effected via a respective bit line combining the memory cells of the individual columns together with the corresponding comparison cell, and addressing by the row being effected via a respective word line combining the single-transistor memory cells belonging to the respective matrix row, the comparator having a voltage drive provided, on one hand, by signals fed to the corresponding bit line and, on the other hand, by a clocked connection between a supply potential and a terminal of the comparator to which the supply potential is applicable, comprising a respective clocked transfer transistor forming a connection between two signal terminals of the comparator and the single-transistor memory cells and the comparison cells, respectively, controlling said signal terminals; a circuit part for generating a clock signal acting jointly on respective gates of the respective transfer transistors, said circuit part being controllable in turn by a clock signal timing the connection between the supply potential and the corresponding supply terminal of the comparator; said circuit part being of such construction that, due to the individual clock signal furnished thereby, said transfer transistors are in a heavily conducting state prior to connection of the comparator to the supply potential and are then switched over and cut off, respectively, simultaneously with activation of the comparator to a state with a higher resistivity than in the heavily conducting state, and then, immediately at the end of the negative edge of the clock signal applying the supply potential to the supply terminal of the comparator, the highly conducting state of said transfer transistors is restored.

2. Memory according to claim 1 wherein the comparator is formed as an RS flip-flop.

3. Memory according to claim 1 wherein the supply potential is ground potential.

4. Memory according to claim 1 wherein said circuit part for generating said clock signal for controlling the transfer transistors is formed of mutually identical self-blocking field-effect transistors.

5. Memory according to claim 4 wherein said self-blocking field-effect transistors are of n-channel type.

6. Memory according to claim 4, comprising a first and a second transistor shunted across one another and connected by respective source terminals thereof via a drain-source path of a third transistor to a reference potential and, via a source-drain path of a fourth transistor to the supply potential; said first transistor having a gate controlled by a first clock signal, said second transistor having a gate controlled by a second clock signal said third transistor having a gate controlled by the clock signal controlling the supply terminal of the comparator, and said fourth transistor having a gate controlled by a third clock signal; and a circuit node between said first and said second transistor and said fourth transistor having potentials thereat, on the one hand, for controlling an output supplying the clock signal for the transfer transistors and, on the other hand, being themselves influenced by the clock signal timing the supply for the comparator, in addition to being controlled via said third transistor.

7. Memory according to claim 6 wherein said circuit node is connected, on the one hand, via a capacitance, to said output supplying the clock signal for controlling the transfer transistors, and is acted upon, on the other hand, via a source-drain path of a fifth transistor, by the clock signal timing the comparator supply which simultaneously acts on a gate of said fifth transistor for timing the supply for the comparator, and said output for supplying the clock signal for the transfer transistors at the respective signal terminals of the comparators being connected to the supply potential via a source-drain path of a sixth transistor controlled by said second clock signal.

8. Memory according to claim 6 including a resistance connected to the gate of said third transistor for controlling said third transistor by the clock signals controlling the supply of the comparators.

9. Memory according to claim 8 whein said resistance is a transistor connected as a resistor.

10. Memory according to claim 7 wherein said capacitance connected to said output supplying the clock signal for controlling the transfer transistors is a field-effect transistor connected as a varactor, and being of the same type as the other transistors in the memory.

11. Memory according to claim 10 wherein said transistor connected as a varactor has a source and a drain connected to said circuit node between said fourth transistor and said first and second transistors, and has a gate connected directly to the output supplying the clock signal for controlling said two transfer transistors to the comparator.

12. Memory according to claim 3 wherein said gate of said third transistor is connected via a source-drain path of a further transistor controller by said third clock signal to reference potential.

13. Memory according to claim 1 including a first transistor for generating said clock signal for controlling the supply terminal of the individual comparators, said first transistor being controlled by a resetting signal and having a source terminal connecting said first transistor to the reference potential and having a drain for controlling a second transistor said second transistor having a source terminal connecting said second transistor to the reference potential, and having a drain connecting said second transistor to the supply potential via a third transistor controlled by a first clock signal, said drain of said second transistor being a signal output for said clock signal for controlling the supply terminal of the comparators and a fourth transistor connected in parallel with said second transistor, said fourth transistor having a gate acted upon by a second clock signal, the parallel circuit of said second and said fourth transistors being connected to the supply potential via a fifth transistor controlled by a control pulse provided for precharging the bit lines of the memory matrix.

14. Memory according to claim 13 including another transistor connected between said fifth transistor on the one hand and said second and said fourth transistors, on the other hand, said other transistor having a gate connected to a source of said fifth transistor.

15. Memory according to claim 9 wherein a source of said fifth transistor as well as drain of said second and said fourth transistors, respectively, are connected to said circuit part for generating the clock signal for controlling the transfer transistors.

16. Memory according to claim 15, wherein said drain of said second transistor supplies the clock signal applying to the supply potential to the supply terminal of the comparators and is connected to a drain and a gate of said fifth transistor in a circuit part generating said clock signal acting on said transfer transistors, and said source of said fifth transistor is directly connected to the gate of the third transistor in said last mentioned circuit part.

17. Memory according to claim 6 wherein said clock signals for controlling said circuit part for generating the control pulses for the supply of the comparators and the corresponding transfer transistors are matched in time with respect to one another in such a manner that said first, said second and said third clock signals have pulses which end simultaneously, each pulse of said first clock signal setting in earlier in time than the corresponding pulse of said third clock signal.

18. Memory according to claim 13 wherein a clock pulse serving for precharging the bit lines starts in time later than the corresponding resetting pulse and ends earlier than said corresponding resetting pulse, and the resetting pulses always fall into a pause between two successive first signal pulses without overlapping the adjacent first signal pulses.

19. Memory according to claim 6 wherein said circuit node between said first, said second and said fourth transistors is connected directly to the output supplying the clock signal for timing said transfer transistors at the comparators, and is further connected via a capacitor to a circuit point carrying the clock signal for controlling the supply terminal of the comparators.

* * * * *